(12) United States Patent
Muthiah et al.

(10) Patent No.: US 10,268,556 B2
(45) Date of Patent: Apr. 23, 2019

(54) SYSTEM AND METHOD FOR SIMULATION RESULTS ANALYSIS AND FAILURES DEBUG USING A DESCRIPTIVE TRACKING HEADER

(71) Applicant: HCL Technologies Limited, Noida (IN)

(72) Inventors: Manickam Muthiah, Chennai (IN); Sathish Kumar Krishnamoorthy, Chennai (IN)

(73) Assignee: HCL TECHNOLOGIES LIMITED, Noida, Uttar Pradesh ( * ) Notice: Subject to any disclaimer, the term of this patent is extended or adjusted under 35 U.S.C. 154(b) by 141 days.

(21) Appl. No.: 15/654,032

(22) Filed: Jul. 19, 2017

(65) Prior Publication Data

US 2018/0246795 A1    Aug. 30, 2018

(30) Foreign Application Priority Data

Feb. 28, 2017 (IN) .............................. 201711007116

(51) Int. Cl.
| | |
|---|---|
| *G06F 17/50* | (2006.01) |
| *G06F 11/26* | (2006.01) |
| *G06F 11/263* | (2006.01) |

(52) U.S. Cl.
CPC ........ *G06F 11/261* (2013.01); *G06F 17/5027* (2013.01); *G06F 11/2635* (2013.01); *G06F 17/5022* (2013.01)

(58) Field of Classification Search
CPC .............. G06F 11/261; G06F 11/2635; G06F 17/5027; G06F 17/5022
See application file for complete search history.

(56) References Cited

U.S. PATENT DOCUMENTS 6,226,716 B1   5/2001  Bauman et al.
6,360,353 B1 * 3/2002  Pember ............ G01R 31/31704
                                                       716/103

(Continued)

FOREIGN PATENT DOCUMENTS

EP           2392932 B1    12/2014

*Primary Examiner* — Naum Levin
(74) *Attorney, Agent, or Firm* — HM Law Group LLP; Vani Moodley, Esq.

(57) ABSTRACT

The present disclosure relates to system(s) and method(s) for simulation results analysis and failures debug using a Descriptive Tracking Header. The method may comprise processing a set of input packets by a Design Under Verification or System Under Verification (DUV/SUV) and mimicking, by a prediction unit corresponding to the DUV/SUV, functionality of the DUV/SUV. The prediction unit may be a part of a testbench and is configured to process a set of input packets to predict a set of expected output packets. In one embodiment, each expected output packet from the set of expected output packets may be attached with a Descriptive Tracking Header. The Descriptive Tracking Header corresponds to metadata associated with the expected output packet. The Descriptive Tracking Header is further updated based on the result of the comparison of the expected output packet against the corresponding actual output packet and used for the generation of simulation results summary for the purpose of simulation results analysis and failures debug.

14 Claims, 6 Drawing Sheets

(56) References Cited

U.S. PATENT DOCUMENTS

| | | | | |
|---|---|---|---|---|
| 6,539,341 B1* | 3/2003 | Li | ............... | G01R 31/3172 |
| | | | | 702/182 |
| 7,260,795 B2* | 8/2007 | Maturana | ............ | G06F 17/5022 |
| | | | | 703/16 |
| 8,135,571 B2* | 3/2012 | Cassani | ............ | G06F 11/263 |
| | | | | 703/13 |
| 8,219,947 B2* | 7/2012 | Bist | ............... | G06F 17/5022 |
| | | | | 703/14 |
| 9,195,784 B2* | 11/2015 | Tseng | ............ | G06F 17/5022 |
| 9,501,595 B2* | 11/2016 | Arbel | ............ | G06F 17/5022 |
| 9,953,132 B2* | 4/2018 | van Rooyen | ..... | H01L 21/76886 |
| 10,006,963 B2* | 6/2018 | Krishnamoorthy | ............ | |
| | | | | G01R 31/31727 |
| 2011/0055780 A1* | 3/2011 | Venell | ............ | G01R 31/31836 |
| | | | | 716/106 |
| 2015/0294038 A1* | 10/2015 | Arbel | ............ | G06F 17/5022 |
| | | | | 703/14 |
| 2016/0142280 A1* | 5/2016 | Krishnamoorthy | ............ | |
| | | | | G01R 31/31727 |
| | | | | 703/20 |

* cited by examiner

─ 400

| Source ID | Destination ID | Channel ID | Sub-Channel ID | ....... | ....... | Packet ID | Unique Index |
|---|---|---|---|---|---|---|---|
| Input Time | Address | Size | Type | ....... | ....... | ....... | Txn/ Pkt Characteristics |
| Duplicate | Encrypted | Fragment No. | ....... | ....... | ....... | ....... | Txn/ Pkt Characteristics |
| Error Injected? | ....... | ....... | ....... | ....... | ..... | ....... | Txn/ Pkt Characteristics |
| ....... | ....... | ....... | ....... | ..... | Compared? | Matched? | Txn/ Pkt Characteristics, Checker Flags |

FIGURE 4

| Source ID | Destination ID | Channel ID | Sub-Channel ID | Number of expected Packets | Number of Actual Packets | Matches |
|---|---|---|---|---|---|---|
| Ethernet 0 | PCIe | Stream 4 | Program 1 | 100 | 100 | 100 |
| Ethernet 1 | PCIe | Stream 2 | Program 5 | 50 | 50 | 49 |

FIGURE 5A

| Source ID | Destination ID | Channel ID | Sub-Channel ID | Size | Error Injected? | Number of expected Packets | Number of Actual Packets | Matches |
|---|---|---|---|---|---|---|---|---|
| Ethernet 0 | PCIe | Stream 4 | Program 1 | Small | 0 | 120 | 120 | 120 |
| Ethernet 0 | PCIe | Stream 4 | Program 1 | Large | 10 | 250 | 250 | 240 |

FIGURE 5B

| Source ID | Destination ID | Channel ID | Sub-Channel ID | Error Injected? | Number of expected Packets | Number of Actual Packets | Matches |
|---|---|---|---|---|---|---|---|
| Ethernet 0 | PCIe | Stream 4 | Program 1 | 10 | 370 | 370 | 360 |
| Ethernet 1 | PCIe | Stream 7 | Program 3 | 25 | 250 | 225 | 225 |

FIGURE 5C

| Source ID  | Destination ID | Channel ID | Sub-Channel ID | Packet ID |
|------------|----------------|------------|----------------|-----------|
| Ethernet 0 | PCIe           | Stream 4   | Program 1      | 0         |
| Ethernet 0 | PCIe           | Stream 4   | Program 1      | 1         |
| Ethernet 0 | PCIe           | Stream 4   | Program 1      | 2         |
| Ethernet 0 | PCIe           | Stream 4   | Program 1      | 3         |
| Ethernet 0 | PCIe           | Stream 4   | Program 1      | 4         |
| Ethernet 0 | PCIe           | Stream 4   | Program 1      | 5         |
| Ethernet 0 | PCIe           | Stream 4   | Program 1      |           |
| Ethernet 0 | PCIe           | Stream 4   | Program 1      |           |
| Ethernet 0 | PCIe           | Stream 4   | Program 1      | 9         |
| Ethernet 0 | PCIe           | Stream 4   | Program 1      | 10        |
| Ethernet 0 | PCIe           | Stream 4   | Program 1      |           |
| Ethernet 0 | PCIe           | Stream 4   | Program 1      |           |
| Ethernet 0 | PCIe           | Stream 4   | Program 1      | 14        |
| Ethernet 0 | PCIe           | Stream 4   | Program 1      | 15        |
| Ethernet 0 | PCIe           | Stream 4   | Program 1      | 16        |
| Ethernet 0 | PCIe           | Stream 4   | Program 1      | 17        |

FIGURE 5D

| Source ID  | Destination ID | Channel ID | Sub-Channel ID | Packet ID |
|------------|----------------|------------|----------------|-----------|
| Ethernet 0 | PCIe           | Stream 1   | Program 1      | 25        |
| Ethernet 0 | PCIe           | Stream 3   | Program 1      | 67        |
| Ethernet 1 | PCIe           | Stream 2   | Program 3      | 10        |
| Ethernet 1 | PCIe           | Stream 4   | Program 2      | 67        |

FIGURE 5E

SYSTEM AND METHOD FOR SIMULATION RESULTS ANALYSIS AND FAILURES DEBUG USING A DESCRIPTIVE TRACKING HEADER

CROSS-REFERENCE TO RELATED APPLICATIONS AND PRIORITY

The present application claims priority from Indian Patent Application No. 201711007116 filed on 28 Feb., 2017, the entirety of which is hereby incorporated by reference.

TECHNICAL FIELD

The present disclosure in general relates to the field of hardware logic/electronic design/digital circuits verification and failure analysis. More particularly, the present invention relates to simulation results analysis and failures debug for a Design Under Verification/System Under Verification.

BACKGROUND

Integrated Circuit Design (ICD) or Chip Design is a branch of electronics engineering. ICD deals with encompassing the particular logic and circuit design techniques required for designing integrated circuits, or ICs. Initially, the integrated circuits contained only a few transistors. However, the number of transistors in the integrated circuits has increased dramatically since then. The term "large scale integration" (LSI) was first used to describe this theoretical concept, which further gave rise to the terms "small-scale integration" (SSI), "medium-scale integration" (MSI), "very-large-scale integration" (VLSI), and "ultra-large-scale integration" (ULSI). The development of VLSI started with hundreds of thousands of transistors in the early 1980s, and has continued beyond ten billion transistors as of now.

Modern ICs are immensely complicated. The complexity of modern IC design and market pressure for producing designs rapidly has led to the extensive use of automated design tools in process of IC designing. In short, the design of an IC using Electronic Design Automation (EDA) is the process of design, verification and testing of the instructions that the IC has to carry out.

Electronic Design Automation (EDA) and Electronic Computer-Aided Design (ECAD) is a category of tools that is used to design electronic systems such as integrated circuits as well as printed circuit boards. Designers use these tools that work together in a flow to design and analyze the entire semiconductor chips. EDA tools are essential for designing modern semiconductor chips which have billions of components. The EDA tools help chip design with programming languages that compiled them to silicon. Due to immediate result, there was a considerable increase in the complexity of the chips that could be designed, with improved access to design verification tools that are based on Logic Simulation. A chip designed using this process is easier to lay out and more likely to function correctly, since the design of the chip could be simulated more thoroughly prior to construction. Although the languages and tools have evolved, this general approach of specifying the desired behaviour in a textual programming language and letting the tools derive the detailed physical design has remained the basis of digital IC design even today.

A Simulation (or "sim") is an attempt to model a real-life or hypothetical situation on a computer to study the working of the system. Predictions may be made about the behaviour of the system, by changing variables in the simulation. It is a tool to virtually investigate the behaviour of the system under study.

A Logic simulation is the use of simulation software for predicting the behaviour of digital circuits and Hardware Description Languages (HDL). It simulates the logic before it is built. Simulations have the advantage of providing a familiar look and feel to the user in that it is constructed from the same language and symbols used in design. Simulation is a natural way for the designer to get feedback on their design, by allowing the user to interact directly with the design. Logic simulation may be used as part of the Functional Verification process in designing hardware.

Functional verification is the process followed for verifying whether the logic design conforms to the design specification. In everyday terms, functional verification asserts whether the proposed design do what is intended. This is a complex task, and takes the majority of time and effort in most large electronic system design projects.

Hardware Description language (HDL) is a specialized computer language used for describing the structure and behaviour of electronic circuits, and most commonly, digital logic circuits. A hardware description language enables a precise, formal description of an electronic circuit which allows for the automated analysis and simulation of an electronic circuit. A hardware description language is much like a programming language such as C Programming language. HDL is a textual description language consisting of expressions, statements and control structures. One important difference between most programming languages and HDLs is that HDLs explicitly include the notion of time. The key advantage of a HDL, when used for systems design, is that it allows the behaviour of the required system to be described (modelled) and verified (simulated) before synthesis tools translate the design into real hardware (gates and wires). With time, VHDL and Verilog emerged as the dominant HDLs in the electronics industry, while older and less capable HDLs gradually disappeared. Over the years, much effort has been invested in improving HDLs. The latest iteration of Verilog, formally known as System Verilog, introduces many new features (classes, random variables, and properties/assertions) to address the growing need for better testbench randomization, design hierarchy, and reuse.

A testbench is an (often virtual) environment used to verify the correctness or soundness of a design or model. In the context of firmware or hardware engineering, a testbench refers to an environment in which the design/system/product under development is verified with the aid of software and hardware tools. The suite of verification tools is designed specifically for the design/system/product under verification. Testbench, commonly referred as verification environment (or just environment) contains a set of components such as bus functional models (BFMs), bus monitors, memory modules, and interconnect of such components with the Design Under Verification (DUV).

A simulation environment is typically composed of several types of components: The Generator generates input vectors that are used to search for anomalies that exist between the intent (specifications) and the implementation (HDL Code). Modern generators create directed-random and random stimuli that are statistically driven to verify random parts of the design. The randomness is important to achieve a high distribution over the huge space of the available input stimuli. To this end, users of these generators intentionally under-specify the requirements for the generated tests. It is the role of the generator to randomly fill this gap. This allows the generator to create inputs that reveal bugs not being searched by the user. Generators also bias the stimuli towards design corner cases to further stress the logic. Biasing and randomness serve different goals and there are trade-offs between them. As a result, different generators have a different mix of these characteristics. Since the input for the design must be valid (legal) and many targets (such as biasing) should be maintained, many generators use the constraint satisfaction problem (CSP) technique to solve the complex verification requirements. The legality of the design inputs and the biasing arsenal are modelled. The model-based generators use this model to produce the correct stimuli for the target design.

Drivers translate the stimuli produced by the generator into the actual inputs for the design under verification. Generators create inputs at a high level of abstraction, as transactions and drivers convert this input into actual design inputs as defined in the specification of the design's interface.

A Monitor converts the state of the design and its outputs to a transaction abstraction level so it can be stored in a scoreboard's database to be checked later on.

The Scoreboard/Checker validates that the contents of the scoreboard are legal. There are cases where the generator creates expected results, in addition to the inputs. In these cases, the checker must validate that the actual results match the expected ones.

An Arbitration Manager is configured to manage all the above components together.

The simulator produces the outputs of the design, based on the design's current state (the state of the flip-flops) and the injected inputs. The simulator has a description of the design net-list. This description is created by synthesizing the HDL to a low gate level net-list.

Simulation based verification is widely used to "simulate" the design, since this method scales up very easily. Stimulus is targeted to exercise each line in the HDL code. A testbench is built to functionally verify the design by providing meaningful scenarios to check that given certain input, the design performs to the specification.

The level of effort required to debug and then verify the design is proportional to the maturity of the design. That is, early in the design's life, bugs and incorrect behaviour are usually found quickly. As the design matures, the simulation requires more time and resources to run, and errors will take progressively longer to be found.

One of the most critical tasks in developing a new hardware such as Integrated Circuit (IC) chips, Field-Programmable Gate Arrays (FPGA), Application-Specific Integrated Circuits (ASIC), System On Chips (SOC) etc. is to verify them for different design/function/performance specifications. These specifications may be predefined by the customer of the chips or can be an industry standard too. Another challenge faced by the verification team of this hardware is to debug the failures (if any) that arises during the process of verification using the log file(s) and identify the root cause of the failure.

The input packets/transactions entering a Design Under Verification/System Under Verification (DUV/SUV) might take different data paths, undergo headers or contents changes, get duplicated, endure different delays etc. and make it to the DUV/SUV output via different interfaces. While verifying such complex systems, it sometimes becomes difficult and tedious to generate different types of simulation results summary/statistics in terms of the packets' characteristics/properties for the purpose of results/failures analysis and debugging using the regular logs that are generated during a simulation. Currently, there exists no standard mechanism to achieve this.

The method described here aims at reducing the simulation failures' debug time by providing the user with simulation results summary/statistics in different formats and quick traceability to missing/mismatching packets and their sources.

SUMMARY

This summary is provided to introduce aspects related to systems and methods for simulation results analysis and failures debug for at least one of a Design Under Verification or System Under Verification (DUV/SUV) using a Descriptive Tracking Header and the aspects are further described below in the detailed description. This summary is not intended to identify essential features of the claimed subject matter nor is it intended for use in determining or limiting the scope of the claimed subject matter.

In one embodiment, a computerized system having a processor and a storage device (memory), for simulation results analysis and failures debug using a Descriptive Tracking Header is illustrated. The system comprises a Design Under Verification or System Under Verification (DUV/SUV) and a testbench configured to communicate with the DUV/SUV. The DUV/SUV is configured to process a set of input packets generated by a Stimulus Generator/Driver of the testbench. The testbench further includes a prediction unit corresponding to the DUV/SUV, and a Scoreboard/Checker. The system further comprises a scripted parsing unit. The prediction unit is configured to process a set of input packets to predict a set of expected output packets. In one embodiment, each expected output packet from the set of expected output packets is attached with a Descriptive Tracking Header. The Descriptive Tracking Header corresponds to metadata associated with the expected output packet. In one embodiment, the Descriptive Tracking Header includes a "Unique Index", a "Compared" field, a "Matched" field, and a set of other user desired fields. Further, the prediction unit is configured to populate the "Unique Index" field in the Descriptive Tracking Header associated with each expected output packet, from the set of expected output packets, based on processing of the set of input packets. Further, the prediction unit is configured to record the set of expected output packets with the Descriptive Tracking Header in a first log file. The Scoreboard/Checker is configured to accept a set of actual output packets, generated by the DUV/SUV post processing the set of input packets, and compare the set of actual output packets against a subset of expected output packets from the set of expected output packets. Further, the Scoreboard/Checker is configured to update the "Compared" field and the "Matched" field in the Descriptive Tracking Header of each expected output packet from the subset of expected output packets based on the result of comparison of each actual output packet from the set of actual output packets with the corresponding expected output packet from the subset of expected output packets. Finally, the scripted parsing unit is configured to generate a simulation results summary based on a result format specified by a user and the Descriptive Tracking Headers corresponding to the set of expected output packets. The simulation results summary may be maintained in a separate file.

In one embodiment, a method for simulation results analysis and failures debug using a Descriptive Tracking Header is illustrated. The method may comprise processing a set of input packets by a Design Under Verification or System Under Verification (DUV/SUV). The method may further comprise mimicking, by a prediction unit corresponding to the DUV/SUV, functionality of the DUV/SUV. The prediction unit may be a part of a testbench, wherein the prediction unit is configured to process a set of input packets to predict a set of expected output packets. In one embodiment, each expected output packet from the set of expected output packets may be attached with a Descriptive Tracking Header. The Descriptive Tracking Header corresponds to metadata associated with the expected output packet. The Descriptive Tracking Header may include a "Unique Index", a "Compared" field, a "Matched" field, and a set of other user desired fields. The prediction unit is further configured to populate the "Unique Index" field in the Descriptive Tracking Header associated with each expected output packet, from the set of expected output packets, based on processing of the set of input packets. Further, the prediction unit is configured to record the set of expected output packets with the Descriptive Tracking Header in a first log file. The method may further comprise accepting, by a scoreboard/checker of the testbench, a set of actual output packets, generated by the DUV/SUV post processing the set of input packets, and comparing the set of actual output packets against a subset of expected output packets from the set of expected output packets. The method may further comprise updating, by the scoreboard/checker of the testbench, the "Compared" field and the "Matched" field in the Descriptive Tracking Header of each expected output packet from the subset of expected output packets based on the result of comparison of each actual output packet from the set of actual output packets with the corresponding expected output packet from the subset of expected output packets. The method may further comprise generating, by a scripted parsing unit, a simulation results summary based on a result format specified by a user and the Descriptive Tracking Headers corresponding to the set of expected output packets, wherein the simulation results summary is maintained in a separate file.

BRIEF DESCRIPTION OF DRAWINGS

The detailed description is described with reference to the accompanying figures. In the figures, the left-most digit(s) of a reference number identifies the figure in which the reference number first appears. The same numbers are used throughout the drawings to refer like features and components.

FIG. 4 illustrates a Descriptive Tracking Header template for simulation results analysis and failures debugging of the DUV/SUV, in accordance with an embodiment of the present subject matter.

FIG. 5A, 5B, 5C, 5D and 5E illustrates simulation result summary formats generated using post-processing script, in accordance with an embodiment of the present subject matter.

DETAILED DESCRIPTION

The present system enables simulation results analysis and failures debugging of a Device Under Verification (DUV) or a system under verification (SUV) using a Descriptive Tracking Header. Initially, the Descriptive Tracking Header is inserted into each of the expected output packets/transactions while the packets/transactions are predicted in a testbench. It must be noted that the Descriptive Tracking Header is not inserted into the actual packets/transactions that are processed by the DUV/SUV. The Descriptive Tracking Header template may be customized to suit project needs that are specified by a user. The Descriptive Tracking Header is configured to record metadata corresponding to packets/transactions while the packets/transactions are predicted in a testbench. The testbench is further configured to update/use the metadata captured in the Descriptive Tracking Header for simulation results analysis and failures debugging of the Device Under Verification or the System Under Verification.

In one embodiment, the system is configured to reduce simulation results analysis and failures debug time and improve debug efficiency. The system provides the ability to generate simulation results summary/statistics in different formats specified by the user and the information stored in the Descriptive Tracking Headers. The summary/statistics can be used to understand the DUV/SUV response better in a relatively short time. Furthermore, the system can be implemented in complex DUV/SUV verification environments to aid relatively faster verification using the features of the present system. The system is verification methodology independent and can be used in UVM/VMM/OVM Environments.

Figure 1:
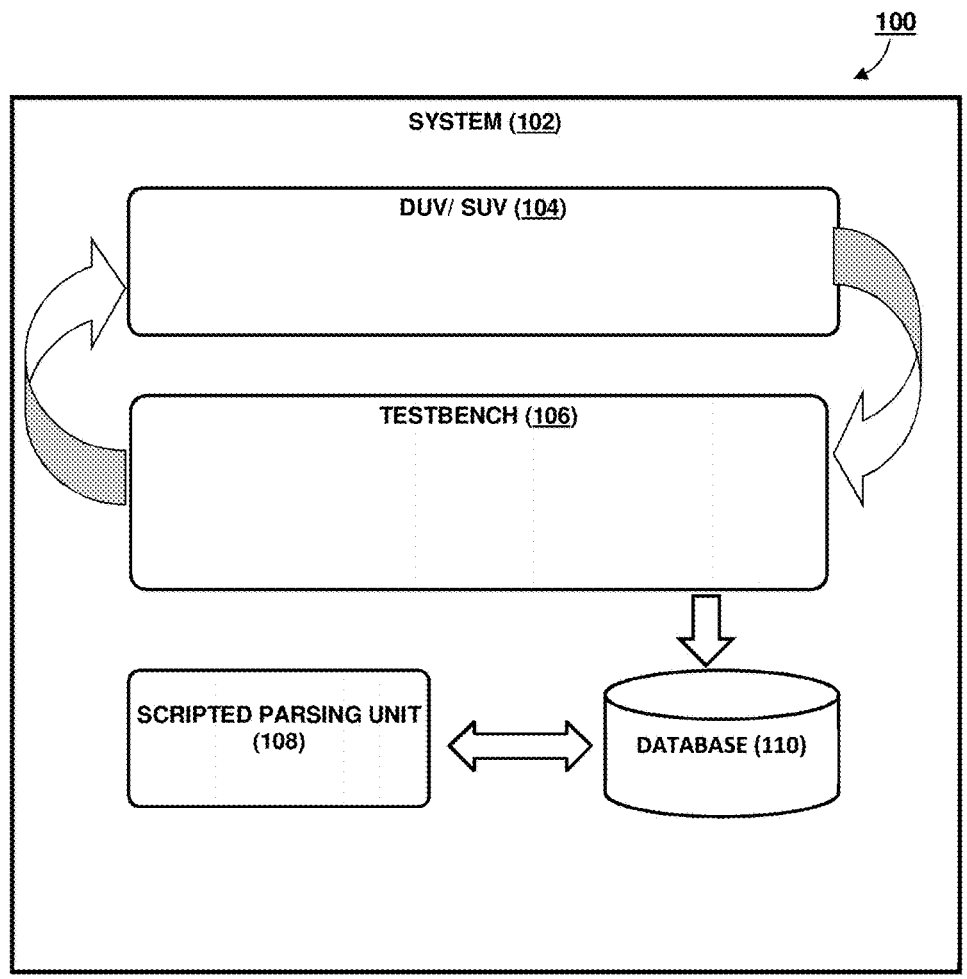
FIG. 1 illustrates an overview of a system configured for verifying a Device Under Verification or a System Under Verification (DUV/SUV) using a Descriptive Tracking Header, in accordance with an embodiment of the present subject matter.

Referring now to FIG. 1, an overview of a system 102 configured for verifying a Device Under Verification or a system under verification using a Descriptive Tracking Header is illustrated. The system 102 includes a testbench 106 configured to communicate with a DUV/SUV 104 and a scripted parsing unit 108 configured to communicate with a memory/database 110. In one embodiment, a prediction unit at the testbench 106 is configured to mimic functionality of the DUV/SUV 104. The terms set of input packets and set of input transactions have been used interchangeably in this document.

Further, the prediction unit is configured to process a set of input packets to predict a set of expected output packets. It must be noted that each expected output packet from the set of expected output packets is attached with a Descriptive Tracking Header. As the expected output packets are processed in the prediction unit, the fields in the Descriptive Tracking Header are also updated. The Descriptive Tracking Header is configured to maintain metadata associated with the expected output packet. The prediction unit is further configured to record the set of expected output packets with the Descriptive Tracking Header in a first log file. Further, the scripted parsing unit 108 is configured to generate a simulation results summary based on a result format specified by a user and the Descriptive Tracking Headers corresponding to the set of expected output packets. The simulation results summary may be maintained in a separate file over the database 110. The process of simulation results analysis and failures debugging of the DUV/SUV 104 is further elaborated with respect to FIG. 2.

Figure 2:
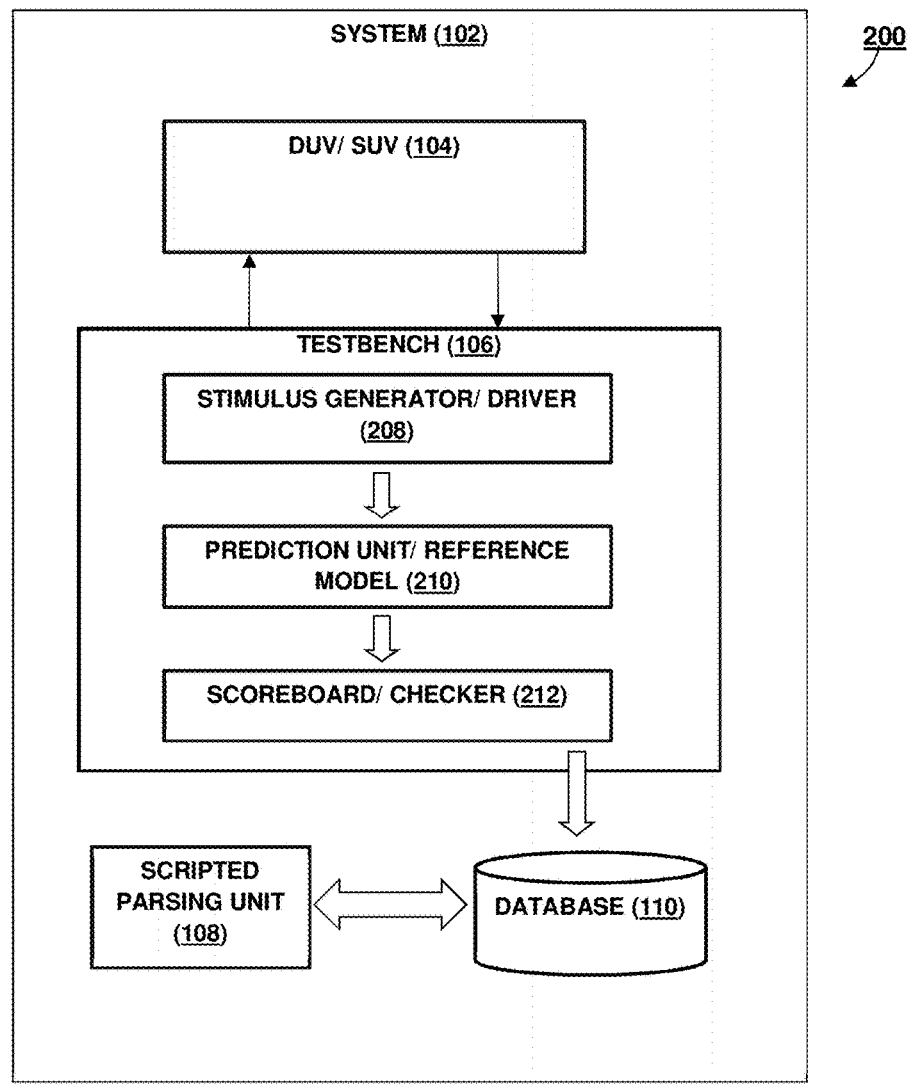
FIG. 2 illustrates components of the system, in accordance with an embodiment of the present subject matter.

Referring now to FIG. 2, the system 102 is illustrated in accordance with an embodiment of the present subject matter. In one embodiment, the system 102 comprises the DUV/SUV 104 connected to the testbench 106. The testbench 106 may include a Stimulus Generator/Driver 208, a prediction unit/reference model 210, and a scoreboard/checker 212.

In one embodiment, based on the configuration inputs provided by the user, the Stimulus Generator/Driver 208 is configured to generate a set of input packets. The set of input packets are generated by the Stimulus Generator/Driver 208 of the testbench 106 for verification of the DUV/SUV 104. Once the set of input packets is generated, in the next step, the Stimulus Generator/Driver 208 is configured to transmit the set of input packets to the DUV/SUV 104. The DUV/SUV 104 is configured to process the set of input packets. Upon processing the set of input packets, the DUV/SUV 104 may or may not generate actual output packets depending on its specification.

Further, the prediction unit 210 is configured to mimic the functionality of the DUV/SUV 104 for processing the set of input packets to predict a set of expected output packets. In one embodiment, each expected output packet from the set of expected output packets is attached with a Descriptive Tracking Header. The Descriptive Tracking Header corresponds to metadata associated with the expected output packet. The Descriptive Tracking Header includes a "Unique Index", a "Compared" field, a "Matched" field, and a set of other user desired fields. In one embodiment, the "Unique Index" may comprise a set of subfields depending on the DUV/SUV functionality. The set of subfields may include one or more fields selected from a "Source ID" field, a "Destination ID" field, a "Channel ID" field, a "Sub-Channel ID" field, and a "Packet ID" field. The Descriptive Tracking Header may further comprise a set of other fields. The set of other fields may include one or more fields selected from a DUV/SUV functionality, an "Input Time" field, an "Address" field, a "Packet Size" field, a "Transaction Type" field, a "Duplicate" field, an "Encrypted" field, a "Fragment Number" field, an "Error Injected" field, and the like.

Further, the prediction unit 210 is configured to populate the "Unique Index" field in the Descriptive Tracking Header associated with each expected output packet, from the set of expected output packets, based on processing of the set of input packets in the prediction unit 210.

The prediction unit 210 is also configured to record the set of expected output packets with the Descriptive Tracking Header in a first log file.

Further, the Scoreboard/Checker 212 is configured to accept the set of actual output packets, generated by the DUV/SUV 104 post processing the set of input packets. The set of actual output packets are compared against a subset of expected output packets from the set of expected output packets by the Scoreboard/Checker 212. It must be noted that the Descriptive Tracking Header is not at all used for comparison and only the packets (the set of actual output packets and the set of expected output packets) are compared.

Post the comparison step, the Scoreboard/Checker 212 is configured to update the "Compared" field and the "Matched" field in the Descriptive Tracking Header of each expected output packet from the subset of expected output packets based on the result of comparison of each actual output packet from the set of actual output packets with the corresponding expected output packet from the subset of expected output packets. In one embodiment, the "Compared" field and the "Matched" field of the Descriptive Tracking Header are by default set to value of zero by the Scoreboard/Checker 212 before the updating process is initiated. For each expected output packet, the "Compared" field of the Descriptive Tracking Header is set to value 1 only when it is compared against the corresponding actual output packet. The "Matched" field is set to value 1 only when the expected output packet matches the corresponding actual output packet.

In one embodiment, the Scoreboard/Checker 212 may be configured to generate a second log file, a third log file and a fourth log file. The second log file may be configured for maintaining a record of Descriptive Tracking Headers with their "Compared" field set to value 1. The third log file may be configured to maintain a record of set of unexpected actual output packets. The set of unexpected actual output packets may correspond to a subset of actual output packets, from the set of actual output packets, which do not have corresponding expected output packets for comparison. The fourth log file may be configured to maintain a record of expected output packets, with Descriptive Tracking Header having "Compared" field and "Matched" field set to value 0. In other words, the fourth log file is configured to maintain the record of the expected output packets that could not be associated with any actual output packets, and it corresponds to missing packets. It must be noted that all the four log files are maintained in the database 110.

Once all the four log files are generated at the end of a simulation, the scripted parsing unit 108 is configured to retrieve the four log files that are maintained in the database 110 and generate a simulation results summary based on a result format specified by a user and the Descriptive Tracking Headers corresponding to the set of expected output packets. The simulation results summary may be generated by parsing the Descriptive Tracking Headers' information, stored in the second log file and the fourth log file, using a post-processing script. The post-processing script may be associated with a scripting language selected from m4, Perl, PHP, Pure, Python, Rebol, Rexx, Ruby or any other scripting language. In one embodiment, the results summary is used for analyzing the simulation results, and efficiently debugging or examining failures in the DUV/SUV 104. The simulation results summary is maintained in a separate file over the database 110. The process of simulation results analysis and failures debugging of the DUV/SUV 104 is further elaborated with respect to FIG. 3.

Figure 3:
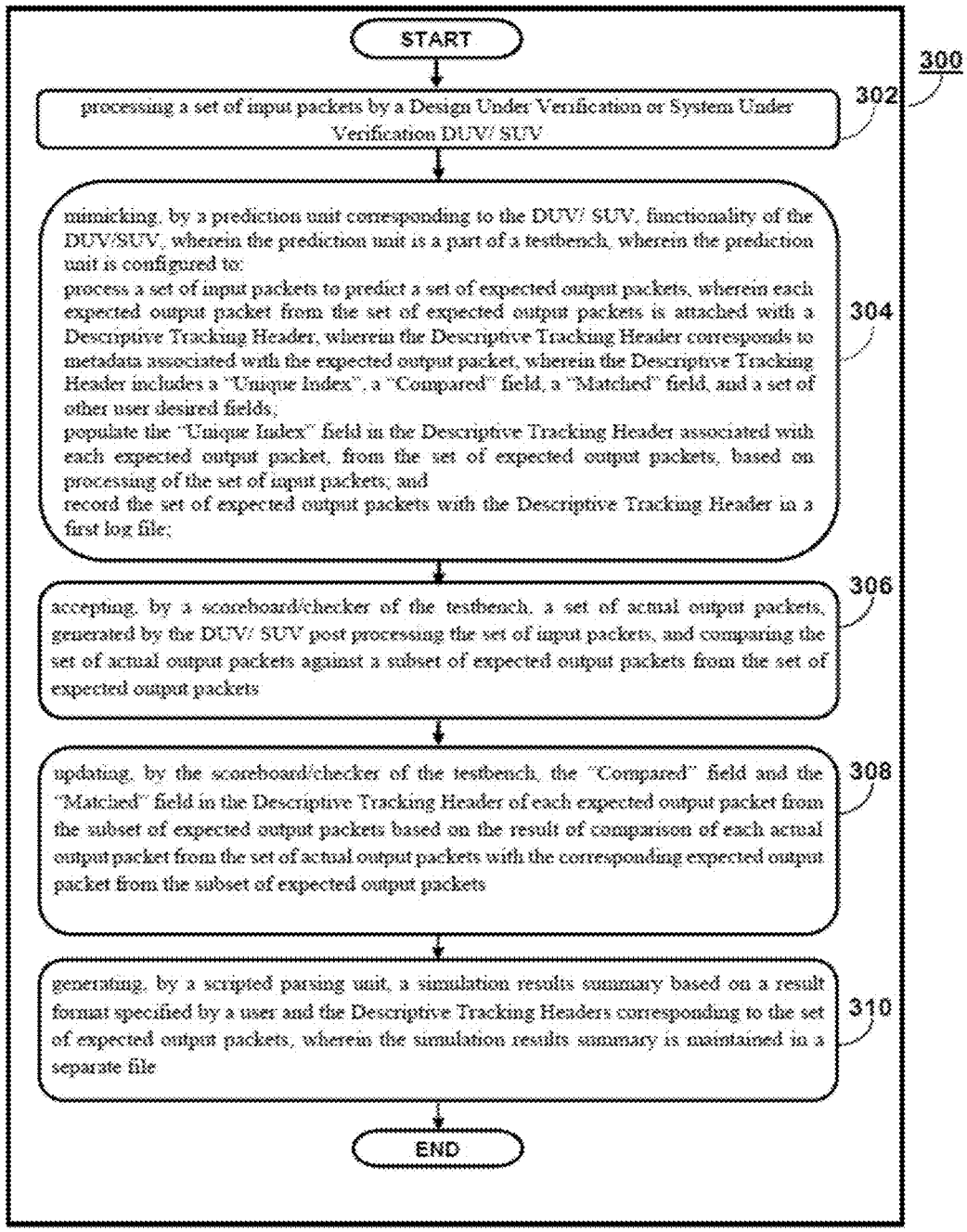
FIG. 3 illustrates a flow diagram for verifying the Device Under Verification or the System Under Verification using a Descriptive Tracking Header, in accordance with an embodiment of the present subject matter.

Referring now to FIG. 3, a method 300 for simulation results analysis and failures debugging of the DUV/SUV 104 is disclosed, in accordance with an embodiment of the present subject matter. The order in which the method 300 is described is not intended to be construed as a limitation, and any number of the described method blocks can be combined in any order to implement the method 300 or alternate methods. Additionally, individual blocks may be deleted from the method 300 without departing from the spirit and scope of the subject matter described herein. Furthermore, the method 300 can be implemented in any suitable hardware, software, firmware, or combination thereof. However, for ease of explanation, in the embodiments described below, the method 300 may be considered to be implemented in the above described system 102.

At block 302, based on the configuration inputs provided by the user, the Stimulus Generator/Driver 208 is configured to generate a set of input packets. The set of input packets are generated by the Stimulus Generator/Driver 208 of the testbench 106 for verification of the DUV/SUV 104. Once the set of input packets is generated, in the next step, the Stimulus Generator/Driver 208 is configured to transmit the set of input packets to the DUV/SUV 104. The DUV/SUV 104 is configured to process the set of input packets. Upon processing the set of input packets, the DUV/SUV 104 may or may not generate actual output packets depending on its specification.

At block 304, the prediction unit 210 is configured to mimic the functionality of the DUV/SUV for processing the set of input packets to predict a set of expected output packets. In one embodiment, each expected output packet from the set of expected output packets is attached with a Descriptive Tracking Header. The Descriptive Tracking Header corresponds to metadata associated with the expected output packet. The Descriptive Tracking Header includes a "Unique Index", a "Compared" field, a "Matched" field and a set of other user desired fields. In one embodiment, the "Unique Index" may comprise a set of subfields depending on the DUV/SUV 104 functionality. The set of subfields may include one or more fields selected from a "Source ID" field, a "Destination ID" field, a "Channel ID" field, a "Sub-Channel ID" field, and a "Packet ID" field. The Descriptive Tracking Header may further comprise a set of other fields. The set of other fields may include one or more fields selected from a DUV/SUV 104 functionality, an "Input Time" field, an "Address" field, a "Packet Size" field, a "Transaction Type" field, a "Duplicate" field, an "Encrypted" field, a "Fragment Number" field, an "Error Injected" field, and the like.

Further, the prediction unit 210 is configured to populate the "Unique Index" field in the Descriptive Tracking Header associated with each expected output packet, from the set of expected output packets, based on processing of the set of input packets in the prediction unit 210.

The prediction unit 210 is also configured to record the set of expected output packets with the Descriptive Tracking Header in a first log file.

At block 306, the Scoreboard/Checker 212 is configured to accept the set of actual output packets, generated by the DUV/SUV 104 post processing the set of input packets. The set of actual output packets are compared against a subset of expected output packets from the set of expected output packets by the Scoreboard/Checker 212. It must be noted that the Descriptive Tracking Header is not at all used for comparison and only the packets (the set of actual output packets and the set of expected output packets) are compared.

At block 308, post the comparison step, the Scoreboard/Checker 212 is configured to update the "Compared" field and the "Matched" field in the Descriptive Tracking Header of each expected output packet from the subset of expected output packets based on the result of comparison of each actual output packet from the set of actual output packets with the corresponding expected output packet from the subset of expected output packets. In one embodiment, the "Compared" field and the "Matched" field of the Descriptive Tracking Header are by default set to value of zero by the Scoreboard/Checker 212 before the updating process is initiated. For each expected output packet the "Compared" field of the Descriptive Tracking Header is set to value 1 only when it is compared against the corresponding actual output packet. The "Matched" field is set to value 1 only when the expected output packet matches the corresponding actual output packet.

In one embodiment, the Scoreboard/Checker 212 may be configured to generate a second log file, a third log file and a fourth log file. The second log file may be configured for maintaining a record of Descriptive Tracking Headers with their "Compared" field set to value 1. The third log file may be configured to maintain a record of set of unexpected actual output packets. The set of unexpected actual output packets may correspond to a subset of actual output packets, from the set of actual output packets, which do not have corresponding expected output packets for comparison. The fourth log file may be configured to maintain a record of expected output packets, with Descriptive Tracking Header having "Compared" field and "Matched" field set to value 0. In other words, the fourth log file is configured to maintain the record of the expected output packets that could not be associated with an actual output packet, and it corresponds to missing packets. It must be noted that all the four log files are maintained in the database 110.

At block 310, once all the four log files are generated at the end of a simulation, the scripted parsing unit 108 is configured to retrieve the four log files that are maintained in the database 110 and generate a simulation results summary based on a result format specified by a user and the Descriptive Tracking Headers corresponding to the set of expected output packets. The simulation results summary may be generated by parsing the Descriptive Tracking Headers' information, stored in the second log file and the fourth log file, using a post-processing script. The post-processing script may be associated with a scripting language selected from m4, Perl, PHP, Pure, Python, Rebol, Rexx, Ruby or any other scripting language. In one embodiment, the results summary is used for analyzing the simulation results, and efficiently debugging or examining failures in the DUV/SUV 104. The simulation results summary is maintained in a separate file over the database 110. The Descriptive Tracking Header used in the process of simulation results analysis and failures debugging is further elaborated with respect to FIG. 4.

Referring now to FIG. 4, the Descriptive Tracking Header 400 is illustrated. The "Unique Index" field is part of the Descriptive Tracking Header for every expected output packet. The "Unique Index" may consist of a number of different sub-fields/IDs depending on the DUV/SUV 104 functionality Each sub-field/ID in the "Unique Index" can be of String/Integer Data Type. In one embodiment, the "Unique Index" may comprise of a "Source ID" (indicative of the Source Interface of the DUV/SUV 104), a "Destination ID" (indicative of the Destination Interface of the DUV/SUV 104), a "Channel ID" (Channel Number for the corresponding packet transmitted from the respective source to the respective destination) and one or more additional fields that may further categorize the packet (for example: "Sub-Channel ID"). The last field/ID in the "Unique Index" is the "Packet ID". The "Packet ID" may be an integer. The "Packet ID" is set to be different, usually incremented for packets that share the rest of the fields. Thus, these different IDs together create a "Unique Index" for each expected output packet making the packet easily identifiable/traceable.

Besides the "Unique Index", there may be other fields in the Descriptive Tracking Header 400 that are used to indicate certain important characteristics of the input packet/transaction that might not be explicit in the corresponding expected output packet/transaction. For example, DUV/SUV 104 Input time for an input packet/transaction, Address, Packet/Transaction Size, Transaction Type, Duplicate, Encrypted, Fragment Number, Error Injected fields may be a part of the Descriptive Tracking Header 400. The number of such fields is not limited and they can be chosen/customized based on the DUV/SUV 104 Functionality.

The Descriptive Tracking Header 400 has two additional fields namely the "Compared" field/flag and "Matched"

field/flag. The "Compared" field and "Matched" field are updated only by the Scoreboard/Checker 212 in the Testbench 106.

In one embodiment, only the required Descriptive Tracking Header fields are populated for each expected output packet during prediction phase. It is further to be noted that the "Compared" field in the Descriptive Tracking Header 400 is by default set to zero indicating that the expected output packet has not been compared yet against the corresponding actual output packet. The "Matched" field in the Descriptive Tracking Header 400 is by default set to zero, indicating that the packet has not matched with any of the actual output packets yet.

Every time after a Descriptive Tracking Header 400 object is created for an expected output packet, its handle is pushed in to a System Verilog Queue (Q1). The System Verilog Queue (Q1) is configured to hold the handles for the Descriptive Tracking Header objects of all the expected output packets/transactions. In one embodiment, each expected output packet data and the corresponding Descriptive Tracking Header data is printed by the prediction unit 210 in a new log file (first log file).

At the comparison stage, when an actual output packet is compared against an expected output packet by the Scoreboard/Checker 212, the Descriptive Tracking Header in the expected packet is not used at all for comparison. Further, the "Compared" field in the corresponding Descriptive Tracking Header is set to 1 after comparison of the expected output packet with the corresponding actual output packet. Furthermore, the "Matched" is set to 0 when the actual output packet does not match with the expected output packet after comparison. Further, the "Matched" field is set to 1 when the actual output packet matches with the expected output packet after comparison. After each comparison, the expected output packet, actual output packet and the descriptive tracking header are printed/saved in the second log file (Comparison Log). When an actual output packet that does not have a corresponding expected packet is encountered, the actual output packet data is printed/saved in the third log file (Unexpected Packets/Transactions Log).

In one embodiment, after waiting for all the actual output packets/transactions to be received from the DUV/SUV 104, each of the handles stored in the Queue Q1 is retrieved and the "Compared" field in the corresponding Descriptive Tracking Header object is checked. If "Compared" field is zero, then the Descriptive Tracking Header contents are printed/saved in the fourth log file (Missing Packets/Transactions Log).

Once the simulation is complete, the fourth Log file may be used to identify the packets/transactions that were expected but did not make it to the DUV/SUV 104 Output. This can be performed by using the "Unique Index" in each Descriptive Tracking Header data printed in the fourth Log file and locating the corresponding expected output packet in the first log file.

In one embodiment, a post-processing script written in perl or any other scripting language, that can parse the Descriptive Tracking Headers information printed in second log file and fourth log file (after the simulation is complete), is used for generating a simulation results summary based on user inputs specifying user preferred results format. The simulation results summary may be used to analyze the simulation results, debug/examine failures with improved efficiency. The post-processing script may also be used to merge the first, second, third and fourth Log files and print a consolidated results log, wherein each expected vs. actual output packets comparison, unexpected actual packets if any and missing packets if any could be found. Examples of the results summary formats that may be printed are further elaborated with respect to FIGS. 5A, 5B, 5C, 5D and 5E.

Referring to FIG. 5A, 5B and 5C, examples of the results summary formats which are printed by the post-processing script are illustrated. The result summary may be generated by analysis of the log files. In one embodiment, the result summary may be in a tabulated format as represented in FIG. 5A to 5C. The result summary may contain basic information of the packets ("Source ID", "Destination ID", "Channel ID", and "Sub-channel ID"). Furthermore, the result summary may also contain aggregated information corresponding to the number of expected packets, the number of actual packets and the matching information.

Referring to FIG. 5D and 5E, the post-processing script may be configured to print the actual output packets' pattern in a user-specified fashion. FIG. 5D represents the "Packet ID"s for a specific combination of "Source ID", "Destination ID", "Channel ID" and "Sub-Channel ID". This representation can help in quickly understanding the actual packets' pattern for this combination and narrow down the issue in the DUV/SUV 104 in case of failures in less amount of time. As represented in FIG. 5D, packets with "Packet ID" 7 and 12 are missing in the representation. This representation enables the user to quickly identify the missing packets.

Furthermore, the post-processing script may be configured to provide a summary of the "Unique Index" from the Descriptive Tracking Header values for the expected output packets that do not match the corresponding actual output packets as represented in FIG. 5E. Once the "Unique Index" values are known, the corresponding expected output packets and actual output packets in the second log file may be located. Furthermore, using the corresponding Descriptive Tracking Headers information, the mismatches may be investigated with improved efficiency.

We claim:

1. A computerized system having a processor and a storage device, for simulation results analysis and failures debug using a Descriptive Tracking Header, the system comprising:
    a Design Under Verification or System Under Verification DUV/SUV, wherein the DUV/SUV is configured to process a set of input packets;
    a testbench configured to communicate with the DUV/SUV, wherein the testbench includes:
        a prediction unit configured to mimic functionality of the DUV/SUV, wherein the prediction unit is further configured to:
            process the set of input packets to predict a set of expected output packets, wherein each expected output packet from the set of expected output packets is attached with a Descriptive Tracking Header, wherein the Descriptive Tracking Header corresponds to metadata associated with the expected output packet, wherein the Descriptive Tracking Header includes a "Unique Index", a "Compared" field, a "Matched" field, and a set of other user desired fields;
            populate the "Unique Index" field in the Descriptive Tracking Header associated with each expected output packet, from the set of expected output packets, based on processing of the set of input packets; and
            record the set of expected output packets with the Descriptive Tracking Header in a first log file;

a Scoreboard/Checker configured to:
  accept a set of actual output packets, generated by the DUV/SUV post processing the set of input packets, and compare the set of actual output packets against a subset of expected output packets from the set of expected output packets;
  update the "Compared" field and the "Matched" field in the Descriptive Tracking Header of each expected output packet from the subset of expected output packets based on the result of comparison of each actual output packet from the set of actual output packets with the corresponding expected output packet from the subset of expected output packets; and
a scripted parsing unit configured to generate a simulation results summary based on a result format specified by a user and the Descriptive Tracking Headers corresponding to the set of expected output packets, wherein the simulation results summary is maintained in a separate file.

2. The system of claim 1, wherein the set of input packets are generated by the testbench for verification of the DUV/SUV.

3. The system of claim 1, wherein the "Unique Index" comprises a set of subfields depending on the DUV/SUV functionality, wherein the set of subfields include one or more fields selected from a "Source ID" field, a "Destination ID" field, a "Channel ID" field, a "Sub-Channel ID" field, and a "Packet ID" field and wherein the Descriptive Tracking Header further comprises a set of other fields, wherein the set of other fields include one or more fields selected from a DUV/SUV functionality, an "Input Time" field, an "Address" field, a "Packet Size" field, a "Transaction Type" field, a "Duplicate" field, an "Encrypted" field, a "Fragment Number" field, an "Error Injected" field and the like.

4. The system of claim 1, wherein the "Compared" field and the "Matched" field of the Descriptive Tracking Header are set to value 0 (default value), by the Scoreboard/Checker, before the update, and wherein for each expected output packet the update comprises:
  setting the "Compared" field to value 1 when the expected output packet is compared against the corresponding actual output packet, and
  setting the "Matched" field to value 1 when the expected output packet matches the corresponding actual output packet.

5. The system of claim 4, wherein the Scoreboard/Checker is further configured to generate a second log file, wherein the second log file is configured to maintain a record of Descriptive Tracking Headers with their "Compared" field set to value 1.

6. The system of claim 5, wherein the Scoreboard/Checker is further configured to generate a fourth log file, wherein the fourth log file is configured to maintain a record of expected output packets, with Descriptive Tracking Header having "Compared" field and "Matched" field set to value 0, and wherein the record of expected output packets, in the fourth log file, corresponds to missing packets, and wherein the simulation results summary is generated by parsing the Descriptive Tracking Headers' information, stored in the second log file and the fourth log file, using a post-processing script, wherein the post-processing script is associated with a scripting language selected from m4, Perl, PHP, Pure, Python, Rebol, Rexx, Ruby or any other scripting language, and wherein the results summary is used for analyzing the simulation results, and efficiently debugging or examining failures in the DUV/SUV.

7. The system of claim 4, wherein the Scoreboard/Checker is further configured to generate a third log file, wherein the third log file is configured to maintain a record of set of unexpected actual output packets, wherein the set of unexpected actual output packets corresponds to a subset of actual output packets, from the set of actual output packets, that do not have corresponding expected output packets for comparison.

8. A method for simulation results analysis and failures debug using a Descriptive Tracking Header, the method comprising steps of:
  processing a set of input packets by a Design Under Verification or System Under Verification DUV/SUV;
  mimicking, by a prediction unit corresponding to the DUV/SUV, functionality of the DUV/SUV, wherein the prediction unit is a part of a testbench, wherein the prediction unit is configured to:
    process the set of input packets to predict a set of expected output packets, wherein each expected output packet from the set of expected output packets is attached with a Descriptive Tracking Header, wherein the Descriptive Tracking Header corresponds to metadata associated with the expected output packet, wherein the Descriptive Tracking Header includes a "Unique Index", a "Compared" field, a "Matched" field, and a set of other user desired fields;
    populate the "Unique Index" field in the Descriptive Tracking Header associated with each expected output packet, from the set of expected output packets, based on processing of the set of input packets; and
    record the set of expected output packets with the Descriptive Tracking Header in a first log file;
  accepting, by a scoreboard/checker of the testbench, a set of actual output packets, generated by the DUV/SUV post processing the set of input packets, and comparing the set of actual output packets against a subset of expected output packets from the set of expected output packets;
  updating, by the scoreboard/checker of the testbench, the "Compared" field and the "Matched" field in the Descriptive Tracking Header of each expected output packet from the subset of expected output packets based on the result of comparison of each actual output packet from the set of actual output packets with the corresponding expected output packet from the subset of expected output packets; and
  generating, by a scripted parsing unit, a simulation results summary based on a result format specified by a user and the Descriptive Tracking Headers corresponding to the set of expected output packets, wherein the simulation results summary is maintained in a separate file.

9. The method of claim 8, wherein the set of input packets are generated by the testbench for verification of the DUV/SUV.

10. The method of claim 8, wherein the "Unique Index" comprises a set of subfields depending on the DUV/SUV functionality, wherein the set of subfields include one or more fields selected from a "Source ID" field, a "Destination ID" field, a "Channel ID" field, a "Sub-Channel ID" field, and a "Packet ID" field and wherein the Descriptive Tracking Header further comprises a set of other fields, wherein the set of other fields include one or more fields selected from a DUV/SUV functionality, an "Input Time" field, an "Address" field, a "Packet Size" field, a "Transaction Type" field, a "Duplicate" field, an "Encrypted" field, a "Fragment Number" field, an "Error Injected" field, and the like.

11. The method of claim 8, wherein the "Compared" field and the "Matched" field of the Descriptive Tracking Header are set to value 0 (default value), by the Scoreboard/Checker, before the update, and wherein for each expected output packet the update comprises:
setting the "Compared" field to value 1 when the expected output packet is compared against the corresponding actual output packet, and
setting the "Matched" field to value 1 when the expected output packet matches the corresponding actual output packet.

12. The method of claim 11, wherein the Scoreboard/Checker is further configured to generate a second log file, wherein the second log file is configured to maintain a record of Descriptive Tracking Headers with their "Compared" field set to value 1.

13. The method of claim 12, wherein the Scoreboard/Checker is further configured to generate a fourth log file, wherein the fourth log file is configured to maintain a record of expected output packets, with Descriptive Tracking Header having "Compared" field and "Matched" field set to value 0, and wherein the record of expected output packets, in the fourth log file, corresponds to missing packets, and wherein the simulation results summary is generated by parsing the Descriptive Tracking Headers' information, stored in the second log file and the fourth log file, using a post-processing script, wherein the post-processing script is associated with a scripting language selected from m4, Perl, PHP, Pure, Python, Rebol, Rexx, Ruby or any other scripting language, and wherein the results summary is used for analyzing the simulation results, and efficiently debugging or examining failures in the DUV/SUV.

14. The method of claim 11, wherein the Scoreboard/Checker is further configured to generate a third log file, wherein the third log file is configured to maintain a record of set of unexpected actual output packets, wherein the set of unexpected actual output packets corresponds to a subset of actual output packets, from the set of actual output packets, that do not have corresponding expected output packets for comparison.

* * * * *